United States Patent
Pye et al.

[19]

[11] Patent Number: 5,861,743
[45] Date of Patent: *Jan. 19, 1999

[54] HYBRID SCANNER FOR USE IN AN IMPROVED MDA TESTER

[75] Inventors: Richard Pye, Waltham; Moses Khazam, Lexington, both of Mass.

[73] Assignee: Genrad, Inc., Westford, Mass.

[ * ] Notice: This patent issued on a continued prosecution application filed under 37 CFR 1.53(d), and is subject to the twenty year patent term provisions of 35 U.S.C. 154(a)(2).

[21] Appl. No.: 576,008

[22] Filed: Dec. 21, 1995

[51] Int. Cl.$^6$ .................................................. G01R 31/02
[52] U.S. Cl. ..................................... 324/158.1; 324/754
[58] Field of Search .............................. 324/158.1, 73.1, 324/537, 538, 754, 761; 702/121

[56] References Cited

U.S. PATENT DOCUMENTS

| | | | |
|---|---|---|---|
| 3,795,860 | 3/1974 | Sylvan | 324/538 |
| 3,806,800 | 4/1974 | Bove et al. | 324/538 |
| 3,922,537 | 11/1975 | Jackson | 371/25.1 |
| 4,300,207 | 11/1981 | Eivers et al. | 324/73.1 |
| 4,390,837 | 6/1983 | Hotvedt | 324/754 |
| 4,392,107 | 7/1983 | Gollomp | 324/73.1 |
| 5,124,638 | 6/1992 | Winroth | 324/73.1 |
| 5,491,427 | 2/1996 | Ueno et al. | 324/754 |

FOREIGN PATENT DOCUMENTS

| | | |
|---|---|---|
| 0143623A | 6/1985 | European Pat. Off. . |
| 0159907A | 10/1985 | European Pat. Off. . |
| 0494436A | 7/1992 | European Pat. Off. . |

*Primary Examiner*—Ernest F. Karlsen
*Attorney, Agent, or Firm*—Cesari and McKenna, LLP

[57] ABSTRACT

A hybrid scanner for switching internal analog buses to system pin channels. Semiconductor switches switch most scanner buses to system pin channels, but mechanical relays perform switching for at least one bus used for high-current test signals. To perform low-impedance guarding and/or high-current backdriving, the low impedance, high current bus is typically connectable to one or more overdriver circuits and a guard voltage potential through mechanical relays. The scanner is capable of supporting in-circuit tests covering the most significant regions of the fault spectrum can be made more reliable and much smaller and less costly than the scanners conventionally used in traditional broad spectrum testers. It turns out that this test-supporting capability can be achieved by adding only a few mechanical relays to an otherwise semiconductor-switch-based scanner. Only those necessary to support low-impedance and high-current test operations.

7 Claims, 3 Drawing Sheets

HYBRID SCANNER FOR USE IN AN IMPROVED MDA TESTER

BACKGROUND OF THE INVENTION

1. Field of the Invention

The present invention is directed to automatic circuit testers and, in particular, to an improved manufacturing defect analyzer (MDA) having a hybrid scanner.

2. Related Art

For reasonably comprehensive testing of circuit boards, the number of circuit-board test points ("nodes") that test instruments must be connected at one time or another is typically quite large. But the number of points that have to be connected at any one time is relatively a smaller fraction of the total. The test instruments can therefore be multiplexed. The term used in this art for the multiplexing hardware is "scanner."

Some manufacturing defect analyzer (MDA) circuit testers have used semiconductor switches to implement the scanner. Because of the accuracy costs that such switches' high impedances exact, however, they have been employed only in a few testers directed to a very limited region of the fault spectrum. By and large, more comprehensive testers use mechanical relays instead. With such scanners, considerable in-circuit measurement accuracy can be achieved. In addition, some circuit testers perform measurements on powered-up digital circuits, where it is sometimes necessary to force large currents through a pin channel. Semiconductor switches that carry high currents have high capacitance associated with them, making them unsuitable for use in scanners. Semiconductor switches having suitable capacitance values, can only carry a few tens of milliamperes without risking damage, are therefore also unsuitable. As a result, tester manufacturers have borne the significant burdens that mechanical relays impose, such as limited reliability, low probe-addressing flexibility, high relay-energization power requirements, the need to provide mechanical reinforcement to support the relays' added weight, and the much greater space required by the relays, their drivers, and the resultant power supplies.

What is needed, therefore, is a circuit tester scanner that can support tests for identifying defects covering a large portion of the fault spectrum without incurring the above drawbacks of conventional scanners.

SUMMARY OF THE INVENTION

We have recognized that scanners capable of supporting in-circuit tests covering the most significant regions of the fault spectrum can be made more reliable and much smaller and less costly than the scanners conventionally used in traditional broad spectrum testers. It turns out that this test-supporting capability can be achieved by adding only a few mechanical relays to an otherwise semiconductor-switch-based scanner. Only those switches necessary to support low-impedance and high-current test operations are implemented with mechanical switches.

The present invention is a hybrid scanner for switching internal analog buses to system pin channels. Semiconductor switches switch most scanner buses to system pin channels, but mechanical relays perform switching for at least one bus used for high-current test signals. To perform low-impedance guarding and/or high-current backdriving, the low impedance, high current bus is typically connectable to one or more overdriver circuits and a ground voltage potential through mechanical relays.

Because it supports backdriving and guarding test techniques, the scanner of the present invention can be used in a tester that identifies defects such as short circuits, open circuits, missing, incorrect, and backwards components, some bent-lead and analog-specification defects, as well as defects in digital logic, the sum of which account for a significant portion of the PCB fault spectrum. Yet it can be realized in a structure that is much more reliable, lighter, smaller, and less demanding of power than scanners traditionally thought necessary to support such tests.

Further features and advantages of the present invention as well as the structure and operation of various embodiments of the present invention are described in detail below with reference to the accompanying drawings. In the drawings, like reference numbers indicate identical or functionally similar elements. Additionally, the left-most digit of a reference number identifies the drawing in which the reference number first appears.

BRIEF DESCRIPTION OF THE DRAWINGS

These and further features and advantages of the present invention are described in the accompanying drawings, in which.

DETAILED DESCRIPTION OF AN ILLUSTRATIVE EMBODIMENT

Figure 1:
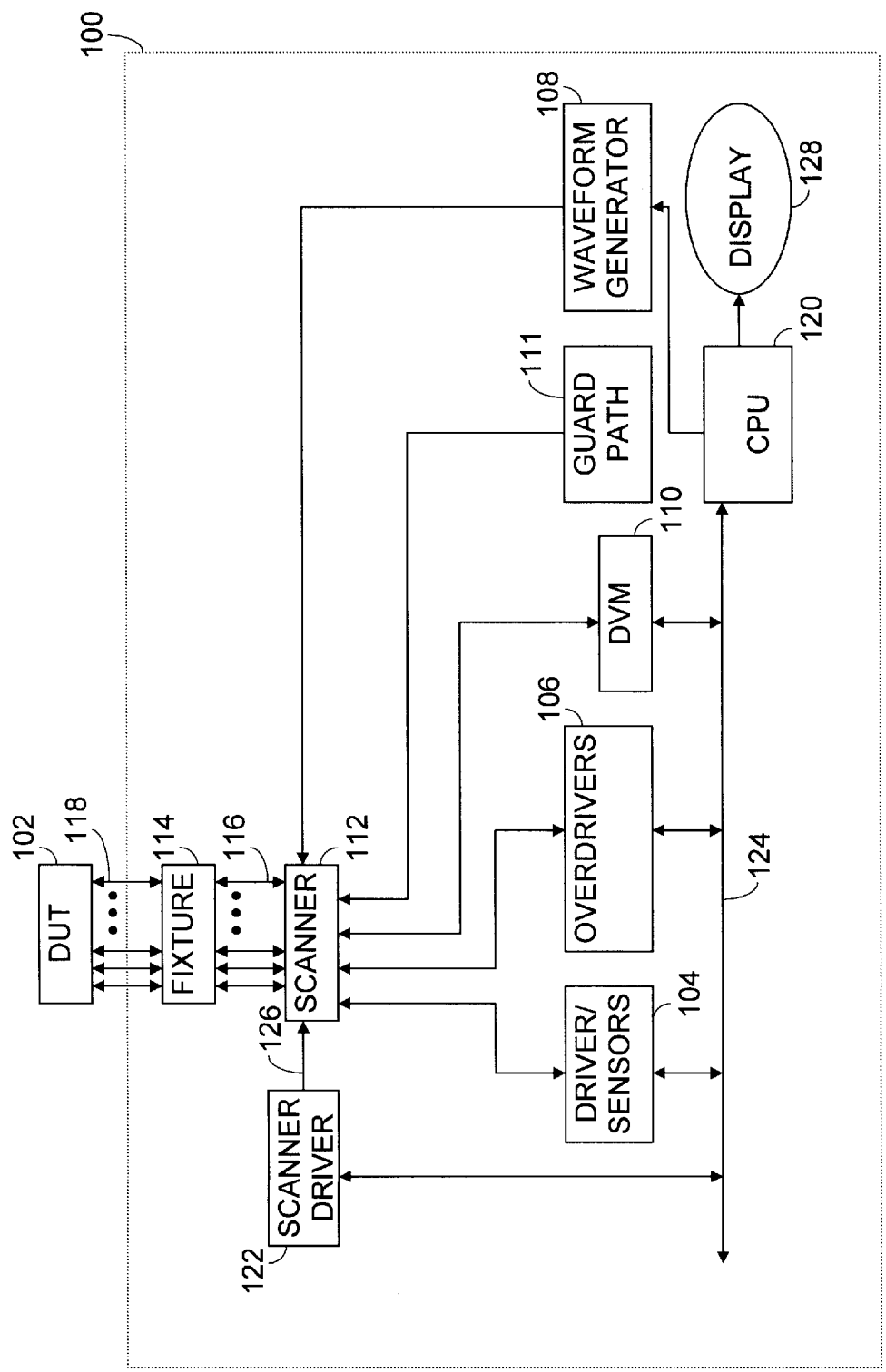
FIG. 1 is a block-diagram form one of an exemplary automatic circuit tester in which the hybrid scanner of the present invention can be employed.

FIG. 1 represents in block-diagram form one of the many types of automatic circuit testers in which the teachings of the present invention can be employed. The tester 100 tests a device under test (DUT) 102 by using digital test instruments in the form of driver/sensors 104 to apply signals to the DUT and observe the resulting signals that appear on the DUT. In addition to the digital instruments 104, a tester may also use overdrivers 106 and analog instruments such as a waveform generator 108, a digital voltmeter 110, and a guard path 111.

To connect the test instruments to the DUT 102, automatic tester 100 employs a scanner 112 of the present invention and a fixture 114. The scanner 112 provides a large number of fixed-position system pins 116 to carry signals to and from the DUT. However, they are not physically positioned to line up with test points on any particular circuit board, and signals on the system pins 116 have to be directed to different physical positions for every board type or family. This is the purpose of the fixture 114, which provides connections between the system pins 116 and fixture pins ("nails") 118 specifically positioned for the desired test points on the DUT 102.

For many DUTs, the number of necessary nails 118 is very large, but only a small number of them are employed at any one time. For instance, a DUT may have a large number of components, which in total require a large number of test points, but each test of an individual component or circuit may involve only the test points that electrically communicate with the particular terminals of that component or circuit and a few others, whose operation must be affected in order to isolate that component or circuit, in a given component's test. The tester leaves all other test points idle. Subsequently, when the system tests other components or circuits on the board, it uses another small subset of the test points and thus another small subset of the nails 118.

Since each part of the test requires only a small subset of all of the nails 116, only a small subset of the system pins 116 are typically employed in any part of the test. In many cases it would therefore be wasteful to provide a separate test instrument dedicated to each system pin 116. This is particularly true of analog instruments, such as digital voltmeters 110 and waveform generators 108, since the number of such instruments used at a time is usually much smaller than that of the driver/sensors 104. The tester therefore includes the scanner 112, which is a matrix of switches and other circuitry that switches the connections between instruments and system pins 116 between test applications so that individual instrument scan be used for different nails for different parts of a test.

The control circuitry for the tester may be embodied in a computer 120 and a scanner driver 122. To set the tester up for a test sequence, the computer 120 communicates with the scanner driver 122 by means of bus 124 to specify the connections that the scanner 112 is to make between the instruments and the system pins 116. The scanner driver 122 responds by applying scanner-control signals to the scanner by means of scanner bus 126. The bus 124 also serves as an instrument bus, carrying instrument-control signals by which the computer 120 programs, say, an analog instrument such as the digital voltmeter 10 if such an instrument is included as a standard part of the tester.

When the test sequence has been completed, the computer 120 reads the results from the driver/sensors 104 and, for instance, the digital voltmeter 110 and uses appropriate equipment such as a display 128 to produce an indication of the results, either then or after further tests have been completed.

Figure 2:
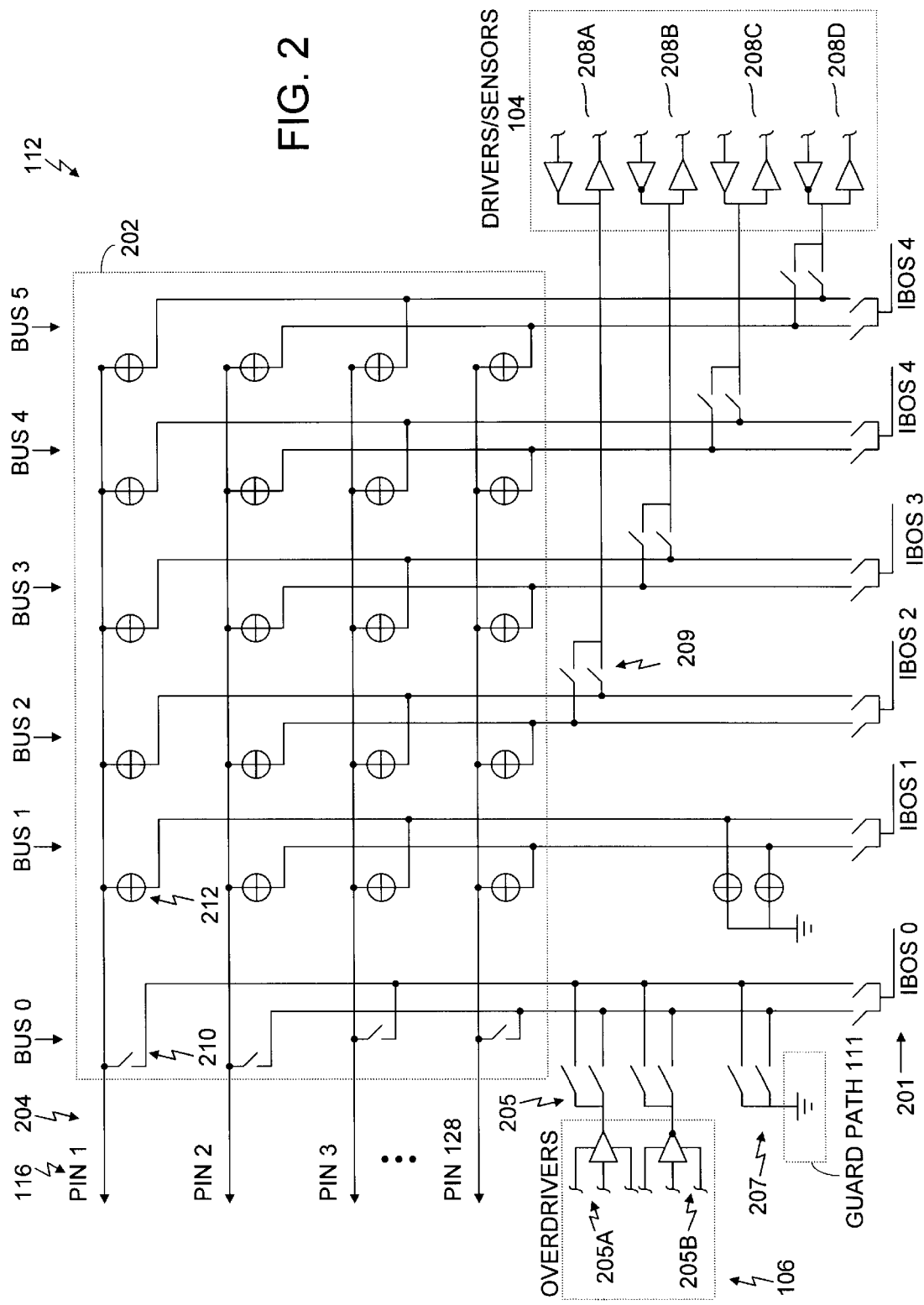
FIG. 2 is a schematic block diagram of the hybrid scanner 112 of the present invention.

FIG. 2 is a schematic block diagram of the hybrid scanner 112 of the present invention. Hybrid scanner 112 includes a matrix 202 for switching internal scanner buses to system pin channels. As will be discussed in detail below, semiconductor switches switch most scanner buses to system pin channels, but mechanical relays perform switching for at least one bus used for high-current test signals.

Each of the scanner buses is connectable to one or more of the test instruments described above with reference to FIG. 1. Scanner 112 is connectable through mechanical relays (discussed below) to overdrivers 106, guard path 111, and driver/sensors 104, which in the preferred embodiment are located on one of the printed-circuit boards on which the scanner switches are mounted. The scanner is coupled to other analog instruments through one or more instrument buses, connected to one or more scanner buses, by mechanical relays 201.

Matrix 202 is implemented with six scanner buses, Bus0–Bus5, preferably having a dual channel configuration. In such an embodiment, one channel of a scanner bus is connectable to some of the system pin channels 204 while the other channel of the same bus is connectable to some or all of the remaining system pin channels. Preferably, this is implemented with each of the two channels of a scanner bus connectable to alternating system pin channels.

As noted, matrix 202 is implemented with a majority of semiconductor switches which, as is well known, have an inherent capacitance which is high compared to the mechanical switches. The accumulation of this capacitance on any single scanner bus channel, which may interfere with the accuracy of test measurements, is avoided with the dual-bus structure of the preferred embodiment. By connecting one of the bus channels to a portion of the system pin channels, the bus channel is only connectable to a portion of the semiconductor switches.

In the preferred embodiment of the present invention, one of the six scanner buses, Bus 0, is dedicated to supporting low impedance guarding and high current backdriving test operations. To provide a low impedance path between system pins 116 and high current Bus 0, mechanical relays 210 are used to connect both channels of Bus 0 to the system pin channels 204.

To maintain a low impedance path, overdrivers 106 and guard path 111 are coupled to Bus 0 with mechanical relays 205 and 207, respectively. Preferably, one overdriver is coupled to each channel of the preferred dual channel Bus 0 by an independently controllable mechanical relay. This enables the dual-channel configuration of the matrix internal buses to provide greater flexibility in performing overdriving/backdriving operations by providing access to two adjacent system pins 203.

Overdrivers 106 are digital drivers that momentarily force an IC input to a desired logic level regardless of what state that input is being held to by another IC. Overdrivers 106 preferably include two overdrivers: overdriver 205A to generate a logic high overdrive signal and overdriver 204B to generate a logic low overdrive signal. As noted, each overdriver 204A, 204B is coupled to both channels of Bus 0 through independently-controllable mechanical relays. Preferably, the logic levels of overdrivers 204 are programmable in the range 0V to 5V with 8-bit resolution (approximately 25 mV). In the illustrative embodiment, each overdriver 204 is configured to overdrive/backdrive one system pin at a given time. However, in the preferred embodiment, each overdriver 106 is capable of sinking or sourcing 500 mA, with a programmable current limit and a resolution of approximately 25 mA. The 500 mA capacity enables each ovedriver to backdrive more than one system pin 116. For example, it may be desirable for overdriver 204A to overdrive two bus driver pins or four normal logic pins on DUT 102. The overdrivers draw power from backdrive rails on the scanner backplane (not shown), which has a total current limit of 2 A to protect system power supplies. In FIG. 2 the leads to the scanner backplane are omitted for clarity.

For low-impedance guarding, guard path 111 provides a ground voltage potential to either or both channels of Bus 0 by independently controllable mechanical relays 207.

In the preferred embodiment, semiconductor switches 212 are DG445 CMOS switches, selected for a compromise between switch resistance and capacitance. CMOS switches 212 have a nominal resistance of approximately 35 ohms, but may be as high as 80 ohms. Two such switches in series will adversely affect measurement accuracy. To prevent this, it is preferable to include only one CMOS switch in a test channel. Accordingly, each of the driver/sensors 104 is connectable to a scanner bus with a mechanical relay such as mechanical relay 209.

The driver/sensors 106 are provided for performing low-accuracy analog stimulus/measurements, and for digital sensing. Each driver can have an independently-programmable voltage level in the range 0V to 5V with 8-bit resolution (about 25mV). Two drivers 208A and 208C are configured to drive to high logic levels while the other two driver/sensors 208B and 208D are configured to drive to low logic levels. In the preferred embodiment, the drivers have a fixed current limit of approximately 25 mA, so each can drive up to 20 standard TTL loads, or 60 LSTTL loads, or a CMOS load with a total capacitance up to 2500 pF. The two pairs of drivers 208A/208B and 208C/208D can support 2 logic families (suitable for UUTs with mixed 5V/3V logic) or can be used in parallel to drive larger loads. The four sensors have independently-programmable reference voltages, again programmable in the range 0V to 5V with 8-bit resolution. Also, the sensors have a 100 kohm input resistance.

Figure 3:
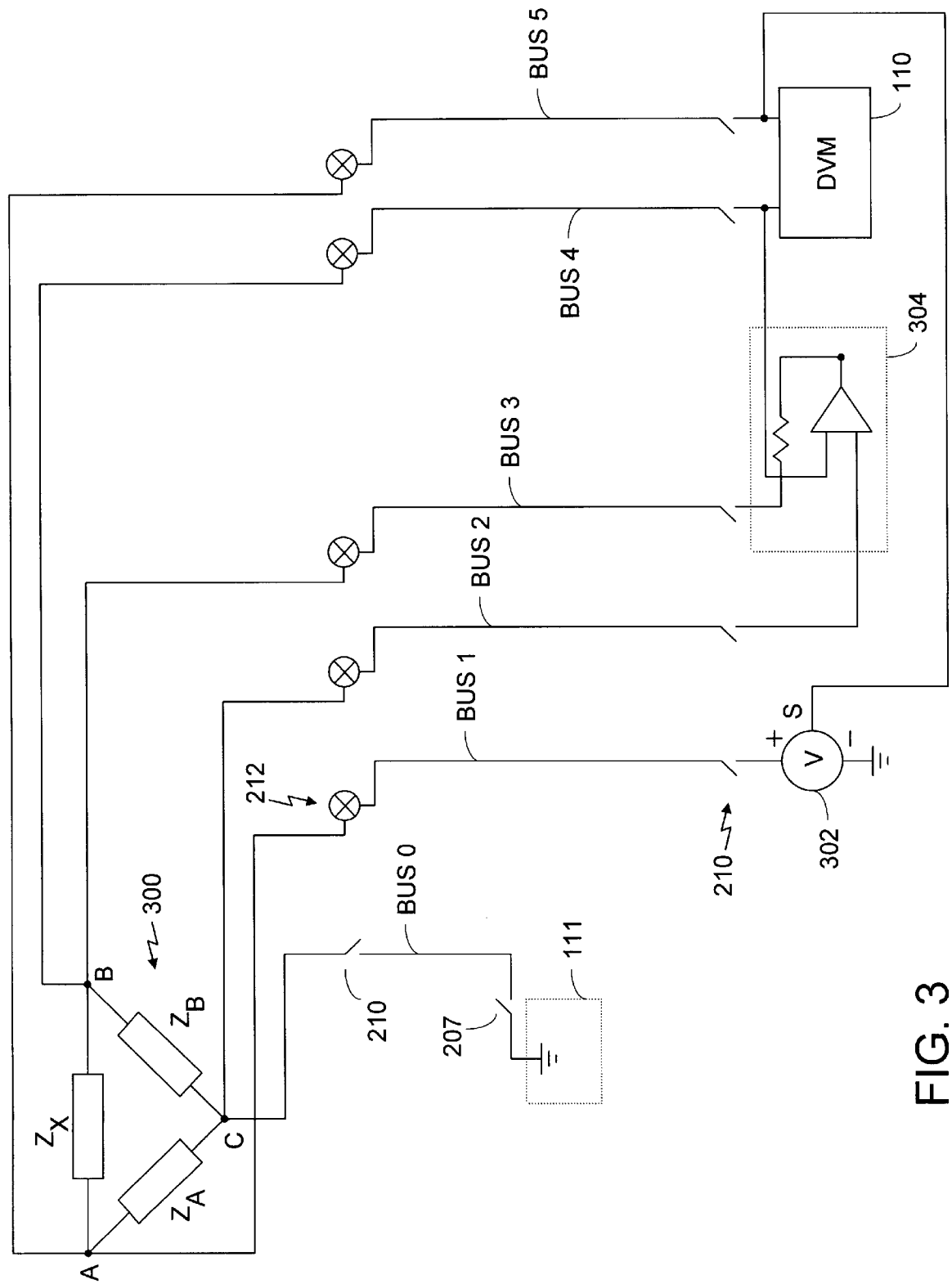
FIG. 3 is a schematic block diagram of an exemplary impedance test using the hybrid circuit of the present invention.

FIG. 3 is a schematic block diagram of an exemplary impedance test. Review of this diagram reveals one of the considerations that gave rise to the present invention. Circuit 300 includes not only impedance $Z_x$, whose value is to be measured, but also impedances $Z_a$ and $Z_b$. This circuit may represent several situations, such as a three terminal standard capacitor where $Z_a$ and $Z_b$ represent stray capacitance at the case or guard (point C). Alternatively, the circuit may represent an impedance, $Z_x$, included in a network where $Z_a$ and $Z_b$ represent actual circuit components shunting $Z_x$. As another example, the circuit 300 may represent any passive three terminal network whose short circuit transfer impedance is desired.

In this illustrative example, the hybrid scanner 112 of the present invention is used to effect a six-terminal measurement configuration. This is a typical measurement configuration long used by in-circuit testers. Historically, the instrument-to-probe connections have been made by relay-only scanners in order to minimize scanner switch resistance, the primary contributor to measurement errors. The reason for this can be appreciated by considering one error source, namely, guard lead error, which renders all-semiconductor switches unsuitable for many testing purposes, such as in low-impedance measurements.

Guard lead error consists mainly of the product of the guard resistance and the impedance of $Z_x$, divided by the product of $Z_a$ and $Z_b$. When the impedance of $Z_x$ is high as compared to $Z_a$ and $Z_b$, then the contribution of this error term is significant. To avoid this, the illustrated hybrid scanner provides access to guard path 111 through mechanical relays, thereby reducing the guard lead error. Specifically, guard terminal C of FIG. 3 is connected to guard path 111 through high-current, low-impedance scanner Bus 0 through relays 210 and 207.

But careful analysis of this configuration also reveals that the low impedance of a mechanical relay is not necessary, as a practical matter, for the other instrument-to-probe connections. For example, the connection of guard terminal C is connected to current meter 304 through scanner Bus 2 and a semiconductor switch 212. In the case of that connection, this error is acceptable because little current flows through it. But even most other higher current connections can be made by semiconductor switch, for example, as illustrated above in FIG. 3 with the use of separate sense and force connections.

Because the measurement errors due to other switch resistances have been rendered negligible, only a few mechanical relays are necessary to obtain the desired accuracy. In the exemplary impedance test shown in FIG. 3, terminal A is connected to a voltage source 302 and DVM 110 through scanner Bus 1 and scanner Bus 5, respectively, through semiconductor switches 212. Terminal B is connected to the output of current meter 304 and DVM 110 via scanner Bus 3 and scanner Bus 4, respectively, through semiconductor switches 212. Terminal C is coupled to the guard sense input of the current meter through scanner Bus 2.

Preferably, to correct for the resistance of the semiconductor switches, the input of the current sensor 304 (sense input) and the current meter resistor (the force input) are coupled to the same node via different paths. In the illustrative example, the input of the current meter is connected to the DVM, and thus to node B through Bus 4 whereas the current meter input is coupled to node B through Bus 3. Since no current flows through the current meter input, it is preferably coupled to Bus 4 since there in no current flow to the DVM 110. However, other connection configurations are well known. Likewise, the voltage source 302 has a sense input coupled to node A through Bus 5 whereas the force input is coupled to node A through Bus 1. It is apparent to those skilled in the art that other configurations are possible to correct for line and switch resistance. For example, the sense lines can be connected to the force lines and the voltage drop across the switch is not corrected for. Instead, the voltage drop across the nodes is measured and considered in the calculations. This configuration is particularly useful when the current through the switch is very high such as when low impedance measurements are performed.

Thus, as noted above, it turns out that adding only a few mechanical relays to an otherwise semiconductor-switch-based scanner enables the scanner to support not only low-impedance testing as illustrated in the exemplary impedance test of FIG. 3, but also, through the use of overdrivers 106 and mechanical relays 205, high-current test operations.

Thus, even though it employs mostly semiconductor switches, the hybrid scanner of the present invention is fully capable of supporting in-circuit tests covering the most significant regions of the fault spectrum with a limited number of mechanical relays. Because it supports backdriving and guarding test techniques, the scanner of the present invention can be used in a tester that identifies defects such as short circuits, open circuits, missing, incorrect, and backwards components, some bent-lead and analog-specification defects, and defects in digital logic, the sum of which account for a significant portion of the PCB fault spectrum.

The scanner achieves this significant test-supporting capability while achieving greater reliability, reduced size, and lower cost than the scanners conventionally used in traditional broad spectrum testers.

For example, the novel implementation of a scanner matrix populated primarily by semiconductor switches rather than mechanical relays significantly reduces cost of the scanner, depending on the number of scanner buses dedicated to carrying low-impedance, high-current test signals.

The significant reduction in switch size reduces the size of the supporting circuit board, thereby eliminating the need for additional mechanical structures to prevent the scanner circuit boards such as those used in all-relay scanners, from warping. Also, four semiconductor switches can fit into the scanner circuit board area of a single mechanical relay, thereby requiring fewer scanner circuit boards for a given scanner configuration as well as simplifying the mechanical packaging of the scanner.

Another advantage is the increased reliability achieved by the hybrid scanner. The contact resistance of mechanical relays tends to increase with their use due to contact surfaces wear. This increased resistance eventually interferes with, and leads to, unreliable operations. By contrast, semiconductor switches can operate for significantly longer periods of time without degradation.

Another advantage of the hybrid scanner of the present invention is its significantly low power consumption. A relay coil dissipitates significant power when energized. A system with numerous mechanical relays requires large and often expensive power supplies, as well as associated power distribution cables. The use of semiconductor switches eliminates the need for such components.

Another advantage of the present invention is the simplicity with which the scanner can be operated. A semiconductor switch can be driven by low-level logic signals whereas mechanical relays need to be driven by specific driver circuits for reliable operation. Such driver circuits add to the cost of the test system and consume broad space and power.

Furthermore, the terms and expressions which have been employed are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:

1. An automatic circuit tester comprising:
   A) a plurality of system pins;
   B) a plurality of instruments selectively coupled to the system pins for producing signals thereat or monitoring signals applied thereto; and
   C) a scanner adapted for coupling to a circuit board under test and comprising:
      i) a plurality of internal buses including a high-current internal bus; and
      ii) a switch matrix for selectively coupling the system pins through the internal buses to the test points, the switch matrix including:
         a) a plurality of mechanical relays operable to couple the system pins selectively through the high-current internal bus to test points of the circuit board under test; and
         b) a plurality of semiconductor switches operable simultaneously with the mechanical relays' coupling of the system pins to the test points to couple the system pins selectively through internal buses other than the high-current bus to test points of the same circuit board under test.

2. The tester of claim 1 wherein:
   A) at least one of the instruments is an overdriver configured to generate high-current test signals; and
   B) the switch matrix further includes one or more second mechanical relays, each associated with one said overdiver for connecting said associated overdriver to said high-current internal bus.

3. The tester of claim 1, wherein said scanner further comprises:
   a guard path selectively coupled to said high current internal bus by a third mechanical relay.

4. The tester of claim 1, wherein:
   A) at least one of the instruments is a driver/sensor; and
   B) the scanner further comprises one or more mechanical relays, each one or more second mechanical relays, each associated with one said driver/sensor, for connecting said associated driver/sensor to said high-current internal bus.

5. In an automatic circuit tester comprising analog instruments, a scanner adapted for coupling an electronic-circuit board thereto and comprising a switch matrix that includes matrix switches, and a control circuit for operating the matrix switches to complete stimulus, sense, and guard paths through the switch matrix and for making analog measurements by so operating the analog instruments as to apply an electrical stimulus signal to the circuit board through the stimulus path and sense a resultant electrical response on the circuit board through the sense path while guarding a guard node on the circuit board through a guard path, the improvement wherein:
   A) some of the matrix switches are electronic switches and others are electromechanical relays;
   B) the guard path includes at least one of the electromechanical relays but no electronic switches; and
   C) at least one of the stimulus path and the sense path includes at least one of the electronic switches.

6. In the method of automatic circuit testing comprising the steps of coupling to an electronic-circuit board a switch matrix that includes matrix switches, operating the matrix switches to complete stimulus, sense, and guard paths through the switch matrix, and making an analog measurement by applying an electrical stimulus signal to the circuit board through the stimulus path and sensing a resultant electrical response on the circuit board through the sense path while guarding a guard node on the circuit board through a guard path, the improvement wherein:
   A) some of the matrix switches are electronic switches and others are electromechanical relays;
   B) the guard path includes at least one of the electromechanical relays but no electronic switches; and
   C) at least one of the stimulus path and the sense path includes at least one of the electronic switches.

7. A method as defined in claim 6 wherein the stimulus and sense paths both include electronic matrix switches.

* * * * *